United States Patent
Lyndaker et al.

(10) Patent No.: US 7,220,095 B2
(45) Date of Patent: May 22, 2007

(54) SELF-THREADING COMPONENT TAPE FEEDER

(76) Inventors: David W. Lyndaker, 17042 Ladue Rd., Holley, NY (US) 14470; Peter M. Davis, 203 Fair Ave., Santa Cruz, CA (US) 95060; John Piccone, 1585 Hermance Rd., Webster, NY (US) 14580

( * ) Notice: Subject to any disclaimer, the term of this patent is extended or adjusted under 35 U.S.C. 154(b) by 153 days.

(21) Appl. No.: 10/154,560

(22) Filed: May 24, 2002

(65) Prior Publication Data
US 2003/0219330 A1 Nov. 27, 2003

Related U.S. Application Data

(60) Provisional application No. 60/311,217, filed on Aug. 9, 2001, provisional application No. 60/293,397, filed on May 24, 2001.

(51) Int. Cl.
*B65B 21/02* (2006.01)
(52) U.S. Cl. .................................................. 414/810
(58) Field of Classification Search ............... 414/411, 414/416.05, 416.06, 806, 810; 226/139, 226/157
See application file for complete search history.

(56) References Cited

U.S. PATENT DOCUMENTS

| | | | | |
|---|---|---|---|---|
| 4,327,482 A | * | 5/1982 | Araki et al. .................. 29/740 |
| 4,610,083 A | | 9/1986 | Campisi et al. | |
| 4,810,154 A | * | 3/1989 | Klemmer et al. ...... 414/222.02 |
| 5,024,720 A | * | 6/1991 | Boss et al. ................... 156/584 |
| 5,191,693 A | * | 3/1993 | Umetsu ........................ 29/429 |
| 5,725,140 A | * | 3/1998 | Weber et al. ................ 226/139 |
| 5,930,857 A | | 8/1999 | Ramos et al. | |
| 6,032,845 A | * | 3/2000 | Piccone et al. ............. 226/139 |
| 6,157,870 A | | 12/2000 | Gfeller et al. | |
| 6,196,783 B1 | | 3/2001 | Foster | |
| 6,269,860 B1 | | 8/2001 | Ishikawa et al. | |
| 6,694,606 B1 | * | 2/2004 | Ohashi et al. ................ 29/740 |
| 2001/0040117 A1 | * | 11/2001 | Easton ........................ 206/714 |

FOREIGN PATENT DOCUMENTS

JP P2000-133659 A * 5/2000

OTHER PUBLICATIONS

Bollinger and Duffie, Computer Control of Machines and Processes 1988 ☐☐Addison-Wesley Publishing Company pp. 343-345.*
English translation of the disclosure of JP 133659 suppiled by the japanese patent office.*

* cited by examiner

*Primary Examiner*—Charles A. Fox
(74) *Attorney, Agent, or Firm*—Schmeiser, Olsen & Watts

(57) ABSTRACT

The present invention is a method and apparatus for the automatic loading and advancement of component feeder tape in a component feeder for use with a pick-and-place system. The feeder employs sensing technology to determine when a component tape leader is inserted into a tape guide, and subsequently auto-loads the feeder with the tape, including initiating the peeling of cover tape. Subsequently, the feeder operates to sense the presence of parts or components in the component tape pockets and to advance the component tape to a position where the first component is presented at the pick location. The feeder is also capable of detecting repeatable features in the component tape in order to automatically determine the component tape pitch.

15 Claims, 10 Drawing Sheets

SELF-THREADING COMPONENT TAPE FEEDER

CROSS REFERENCE

The following related applications are hereby incorporated by reference in their entirety for their teachings:

"SELF-THREADING COMPONENT TAPE FEEDER," Lyndaker et al., application Ser. No. 60/293,397, filed May 24, 2001;

"SELF-THREADING COMPONENT TAPE FEEDER WITH BATCHING CAPABILITY," Lyndaker et al., application Ser. No. 60/311,217, filed Aug. 9, 2001; and "COMPONENT SOURCE INTERCHANGE GANTRY," Peter Davis et al., application Ser. No. 09/897,276 (Pub. No. US2002/0003994 A1), filed Jul. 2, 2001.

This invention relates generally to the production of printed circuit board assemblies (PCBAs) and electronic components, and more particularly to an auto-loading component feeder that is self-threading so as not to require down time for the replenishment of parts from successive component tape sources to a pickup station for retrieval by a pick and place assembly machine.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND AND SUMMARY OF THE INVENTION

The present invention is an automated or self-threading tape feeder device for presentation of parts to a pickup location for subsequent retrieval and soldering or similar attachment to a substrate using a pick and place assembly machine such as Panasonic MPA or a Fuji IP pick and place PCB assembly machine. Component tape used in tape and reel feeding equipment typically comprises a embossed plastic, paper, or similar strip having cavities at regular intervals (tape pitch) containing the part to be mounted on the substrate and a second, plastic cover tape or strip sealed with adhesive (PSA) or heat to the pocket tape in such a manner as to cover the cavity in order to retain the parts therein during transport and use. Such tapes are generally of a limited length that is determined by the size of the components and the diameter of the component reel that supplies the component tape to the feeder. However, this invention relates to a tape feeder device that can feed such component tapes in a variety of formats, wherein the feeder incorporates certain functions and features that enable uninterrupted feeding during the automated changeover of a depleted reel of components with a full reel on the feeding apparatus. Previously this was accomplished via a cumbersome and time consuming process whereby the operator was required to splice the lead edge of the new tape to the trail edge of the previous tape or more commonly remove the feeding mechanism and manually thread the cover tape in and throughout the cover tape peel and take-up mechanism.

Accordingly, the invention further enables one-hand loading of tape reels (or the automated loading of reels with a robotic gantry or similar automated device). Such features enable rapid part replenishment and a minimization or elimination of production down-time experienced in the use of conventional component tape feeders on a circuit board assembly line. The preferred method for automated construction of circuit boards requires the use of high speed pick and place machines that pick components from a pickup location on a feeder and place them at predefined locations on a printed circuit board for subsequent attachment. Normally, the cover tape is peeled back from the component tape at a point just prior to the pickup location as the tape is advanced. This is done for two reasons: (1) to minimize the risk that a component will be dislodged from its pocket or depression before it is retrieved at the pick station; and (2) to eliminate the possibility of contamination. Thus, prior feeder designs have focused on ways in which to combine cover tape peel back, tape advancement, and component presentation mechanisms, sensors and other devices in a relatively compact area immediately adjacent, or in close proximity, to the pickup location.

On the other hand, the present invention takes an entirely new approach to the presentation of component reels in order to provide an automatic loading or self-threading feeder. Furthermore, the feeder design described herein also reduces the complexity of part sensing and presentation, as well as avoiding the need to incorporate numerous functional elements of the feeder in direct proximity of the pickup point. For example, the present invention moves the cover tape peeling function and the component tape drive to locations that are well "upstream" from the pickup location so as to avoid disturbing the components at the pickup location.

Moreover, a feeder produced in accordance with the present invention overcomes erratic tape motion problems associated with sprocket or tooth driven tape feeders. The present feeder does not rely on the engagement and disengagement of a tooth within a component tape drive hole for advancement of the tape. Part stability within the open pocket is compromised when the drive tooth is withdrawn, under pressure, from the corresponding drive hole in the tape. A preferred method incorporates a constant drive to the tape via a friction or traction drive method which results in a more laminar component tape motion profile. Another important objective of the present invention is to incorporate logic that makes it possible to dismount an empty component reel well before the last part has been taken from the component tape currently in the feeder and automatically load up the full reel of parts without interruption to the assembly process.

Heretofore, of the following patent has disclosed automatic threading of film, the relevant portions of which may be briefly summarized as follows:

U.S. Pat. No. 3,993,404, "SELF-THREADING MOTION PICTURE PROJECTOR," issued to Kalart Victor Corp. on Nov. 23, 1976 teaches a means to place a film projecting apparatus in a mode to accommodate the insertion of the film into the transport.

In accordance with the present invention, there is provided automatic and bi-modal operation whereby the tape advance function and tape load function are discrete but concurrent elements of the tape transport system within a feeder.

In accordance with another aspect of the present invention, there is provided an auto-loading component tape feeding apparatus, for feeding a component tape having a plurality of pockets with components held therein by a cover tape, the component tape feeder comprising: a retractable cover tape peeling edge, station for removing and pulling a cover tape from an upper surface of the component tape; a cover tape collection station; and a component pickup location where said component tape is, upon inserting a lead edge of component tape into the auto-loading component tape feeding apparatus, automatically advanced by a drive means in contact with the component tape.

In accordance with yet another aspect of the present invention, there is provided an auto-loading component tape feeding apparatus, for feeding a component tape having a plurality of pockets with components held therein by a cover tape, the component tape feeder comprising: means for supporting a reel of component tape having components disposed within pockets in the component tape, the components being held therein by a cover tape; a cover tape peeling station where the cover tape is peeled from a surface of the component tape; a cover tape collection means, suitable for the disposition of peeled cover tape; a guide for guiding said component tape from said component tape reel support to said cover tape peeling station; a component pickup station; at least one component tape drive mechanism for frictionally engaging a surface of the component tape and advancing the component tape from a location in proximity to the cover tape peeling station and toward said component pickup station; and an open pocket transport region, disposed between said cover tape peeling station and said pick station, where said component tape is advanced by a drive means in contact with a surface thereof over at least a portion of the region where the component tape pockets are uncovered.

In accordance with yet a further aspect of the present invention, there is provided a method of operating a component tape feeder in an auto-loading mode, comprising the steps of: detecting the insertion of a component tape into a tape guide; in response to detecting the insertion of the component tape, automatically advancing, with a first component tape drive nip, the component tape to a cover tape peel position; automatically initiating the peeling of a cover tape from the surface of the component tape to expose components therein; automatically advancing the component tape to a second tape drive nip; detecting the spacing of pockets in the component tape and the presence of components in the pockets; and automatically advancing the component tape to a pickup location, where a first pocket having a component present therein is positioned at the pickup location for retrieval.

In accordance with another aspect of the present invention, there is provided a method of operating an auto-loading component tape feeder to automatically calculate the component tape pitch of a component tape in the feeder, comprising the steps of: advancing the component tape under the control of a frictional drive, said drive being driven by a stepper motor where each step is known to correspond to a particular linear displacement of the component tape; while advancing the component tape, monitoring a sensor capable of detecting the presence of a repeatable feature of the component tape at a spacing equivalent to the pitch of the component tape; and in response to the detection of a first and subsequent repeatable feature by the sensor, determining the intervening linear displacement of the component tape by the frictional drive in order to automatically calculate the component tape pitch.

One aspect of the invention is based on the discovery of techniques for the detection and advancing of components in a pocket tape, as well as the transport of components in an opened pocket tape configuration, and a technique to automatically calculate the pitch or distance between pockets. The techniques allow for the reliable and continuous tape advancement, cover tape removal and precise positioning of component tape, and more particularly the automated threading and loading of such tape.

The techniques can be implemented with a machine that is designed to fit within the form and space constraints of traditional feeders. A machine implementing the invention can include an improved cover tape collection means (e.g., reservoir, reel, downward discharge), a surrogate component cover (stationary, movable or driven), control logic and one or more drive mechanisms to reliably position components within the tape at a pickup location, etc.

The techniques described herein are advantageous because they are both efficient and practical compared to other approaches. As a result of the various aspects of the present invention, component tape feeders may be made to be auto-loading, while assuring the continued and reliable presentation of component parts at a pickup location. As a further result of the improved tape drive aspects of the present invention, it is anticipated that the motion of the component tape will be improved over the somewhat discontinuous motion that is characteristic of conventional sprocket or tooth-driven tape feeders.

Figure 1:
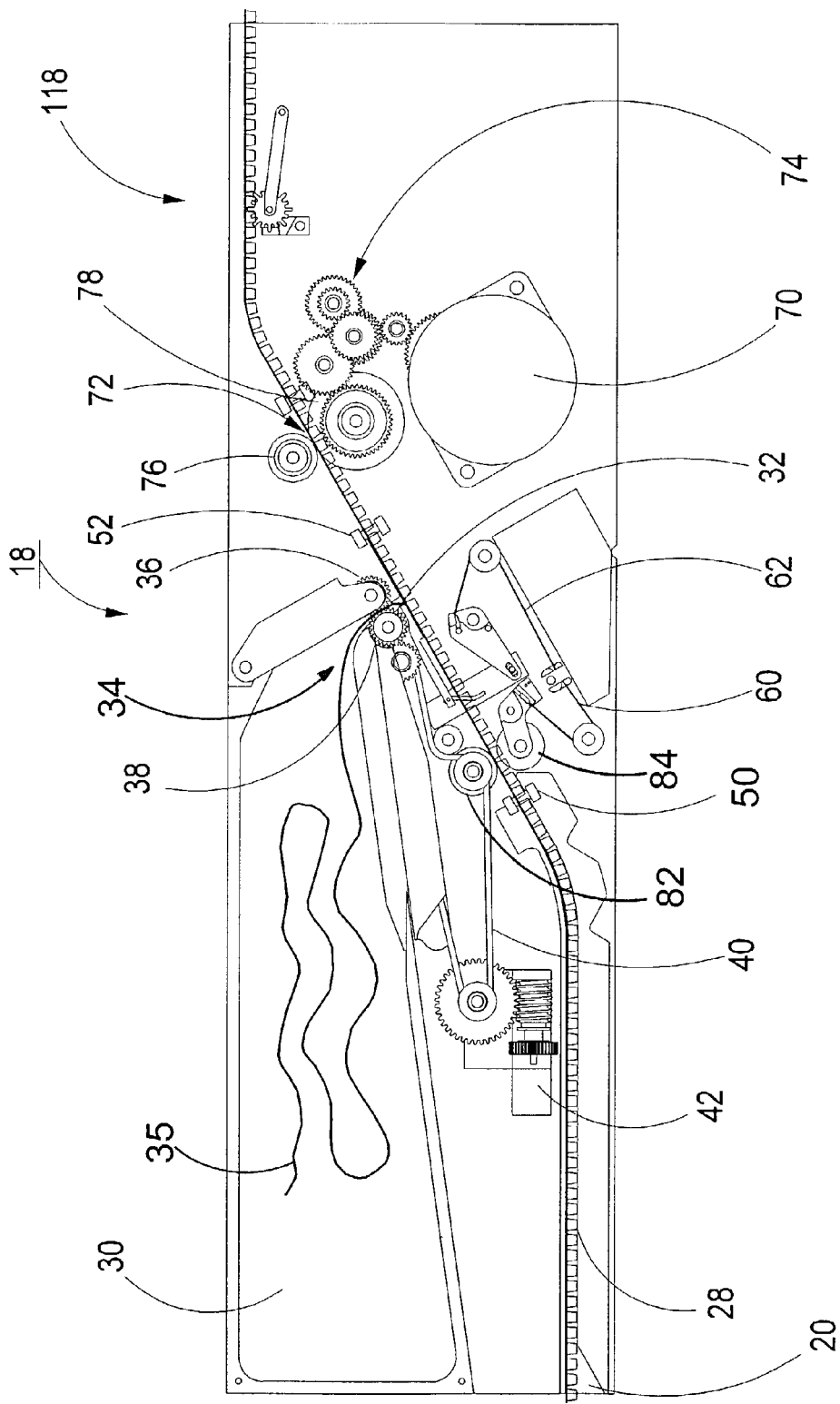
FIG. 1 is a side view of the mechanical features of an embodiment of the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. In describing the present invention, the following term(s) have been used in the description.

A "component" is an item or electronic device that may be positioned on the surface of a printed circuit board by a pick-and-place machine or similar mechanical apparatus for attachment to the board. Components, for purposes of this description are typically delivered to the pick-and-place apparatus within a pocket component tape. A "pocket component tape" is a paper, plastic or similar tape having a series of equidistant cavities or pockets therein, where components may be retained within the depressions and a series of tape drive holes located equidistant along at least one edge of the tape. Such tapes are generally pre-filled with components and are wound on reels for loading into tape feeders. For ease of transport and loading, the components are held within the pockets by a cover tape, which is peeled away from the top surface of the component tape to reveal the components prior to presenting the component to a pickup location. As used herein, the term "auto-loading" or "self-threading" is intended to include any feeder apparatus wherein the beginning of a component tape can be readily engaged within the transport mechanism without any operator intervention within the feeder or removal thereof from a specified location on the placement machine. The transition from a depleted component tape reel to a full replacement reel is accomplished by the feeder in such a way as to reduce or eliminate any delay in providing components to a pickup station where a pick-and-place machine may retrieve the component from the tape.

In general, the present invention is directed to an intelligent, high-performance auto-loading feeder. Component tape reels generally have a section of tape (approximately 46 cm) at the beginning and at the end of the reel that contain no components. These are normally referred to as the tape leader and trailer, respectively. The present invention is intended to operate on component tapes having short or no leader. Referring to FIG. 1, a feeder 18, in accordance with the present invention, is designed so that to install a new reel the operator simply peels back a small length of cover tape on the leader, inserts the tape in the tape guide 20 and inserts the new reel in the reel support means, for example a reel holder or basket 22 (see FIG. 8). It will be appreciated that other well-known support mechanisms, such as axles, rollers, cradles, etc. may also be employed as reel support means in accordance with the present invention and, while being operatively associated with the feeder, are not necessarily directly connected to the feeder.

The feeder detects tape insertion and proceeds to capture and appropriately load the feeder tape transport with the component pocket tape, peel back the cover tape, calculate component pitch detect the presence of a component and advance the component to the pickup point. After the feeder detects end of reel an alarm or signal is triggered to indicate that preparation for auto-loading of a replacement reel is required. When the last part has been picked, the feeder automatically advances the tape trailer out of the feeder's tape transport and readies itself for a new reel. In one embodiment, the feeder is designed to load a component from the new reel to the pickup point in a short period of time (e.g., a few seconds). Cover tape 35, peeled from an upper surface of the component tape, is fed to cover tape collection means 30 such as an operator accessible reservoir after having been peeled at a peel edge 32 and drawn into the reservoir by a cover tape nip 34 having at least two rollers 36 and 38. It will be appreciated that rollers 36 and 38 may also include strippers so as to prevent the tacky peeled cover tape from becoming wound on the rollers. In one embodiment, the cover tape reservoir 30 can accommodate cover tape from multiple reels of component tape. At least one of the rollers 36 or 38 is driven directly, or indirectly via additional gears, by an endless belt 40 that in turn is advanced under the control of motor 42 through a path defined by various pulleys. As will described below, advancement of the belt in the direction indicated by arrow 46 not only drives the cover tape peeling nip 34, but also causes further advancement of the component tape within the tape guide 20.

Although depicted in FIG. 1 as an enclosed reservoir, the cover tape collection means 30 also includes redirecting the peeled cover tape to a common cover tape and component tape reservoir as described, for example in "TAPE FEEDER WITH IMPROVED COVER TAPE DISPOSITION PATH AND DRIVE" Sean E. MacNeil et al., application Ser. No. 09/996,709, filed Nov. 30, 2001, or to wind the cover tape on a disposal reel as disclosed, for example, in "REVOLVING COVER TAPE RESERVOIR FOR A COMPONENT FEEDER," by David Lyndaker et al., application Ser. No. 10/042,601, filed Jan. 9, 2002, the teachings of both co-pending applications being hereby incorporated by reference in the present application.

Motor 42 is preferably a DC motor, and it has two distinct functions in the embodiment depicted in FIG. 1. First the motor advances belt 40 to load the component tape. Second, the motor loads the cover tape in the reservoir by providing the driving force to the cover tape drive nip 34. Tape loading occurs after the shape memory actuator system (described below) forces the pressure roller 84 against the cover tape and directs the cover tape around and past the retracted peel edge 32 and into the tangent point or nip of the cover tape peel back gears At this point in time the DC motor 42 drives the component tape forward by the combination of the pressure roller 84 and the pulling force applied to the tape from the cover tape peeling nip until the tape loaded sensor 52 detects the tape. Subsequently, during normal component feed operation where components are being presented to the pickup location, the DC motor provides, via belt 40, a constant force to the cover tape nip which pushes the peeled cover tape into the collection means 30 and at the same time moves the pocket tape toward the pickup location.

Figure 2:
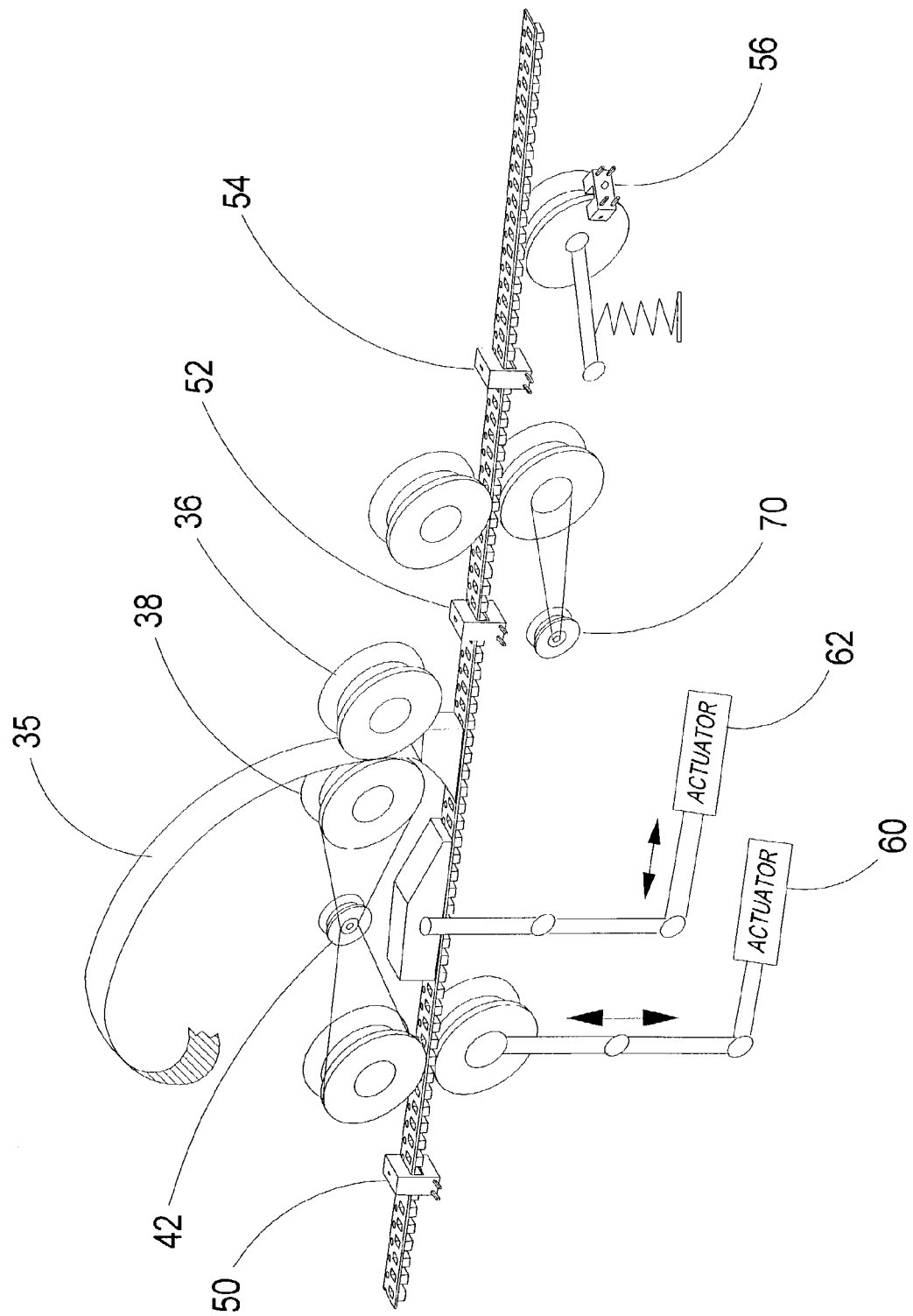
FIG. 2 is a perspective view of the embodiment of FIG. 1 showing the relative placement of electrical sensing devices to detect the presence of component tape, etc.

In the embodiment depicted in FIG. 1, the feeder employs a number of sensors and actuators to detect and control the component tape advancement and to position components at the pickup location Referring also to FIG. 2, where there is depicted a generalized alternative embodiment of the present invention, at least four sensors (50, 52, 54 and 56), two shape-memory wire or similar actuators (60 and 62), a DC motor 42, and a stepper motor 70, control the various systems functions. In one embodiment of the present invention, depicted in FIG. 1, shape-memory actuators are employed to reduce cost and save space in implementing a means for moving an element (e.g., roller pivot, peel edge) of the feeder. However, it will be appreciated that other types of actuators, including motors and solenoids, may be used as equivalent means to engage the auto-loading mechanism. More specifically, the functions of the sensors, will now be described along with their contemplated alternatives.

Figure 3A:
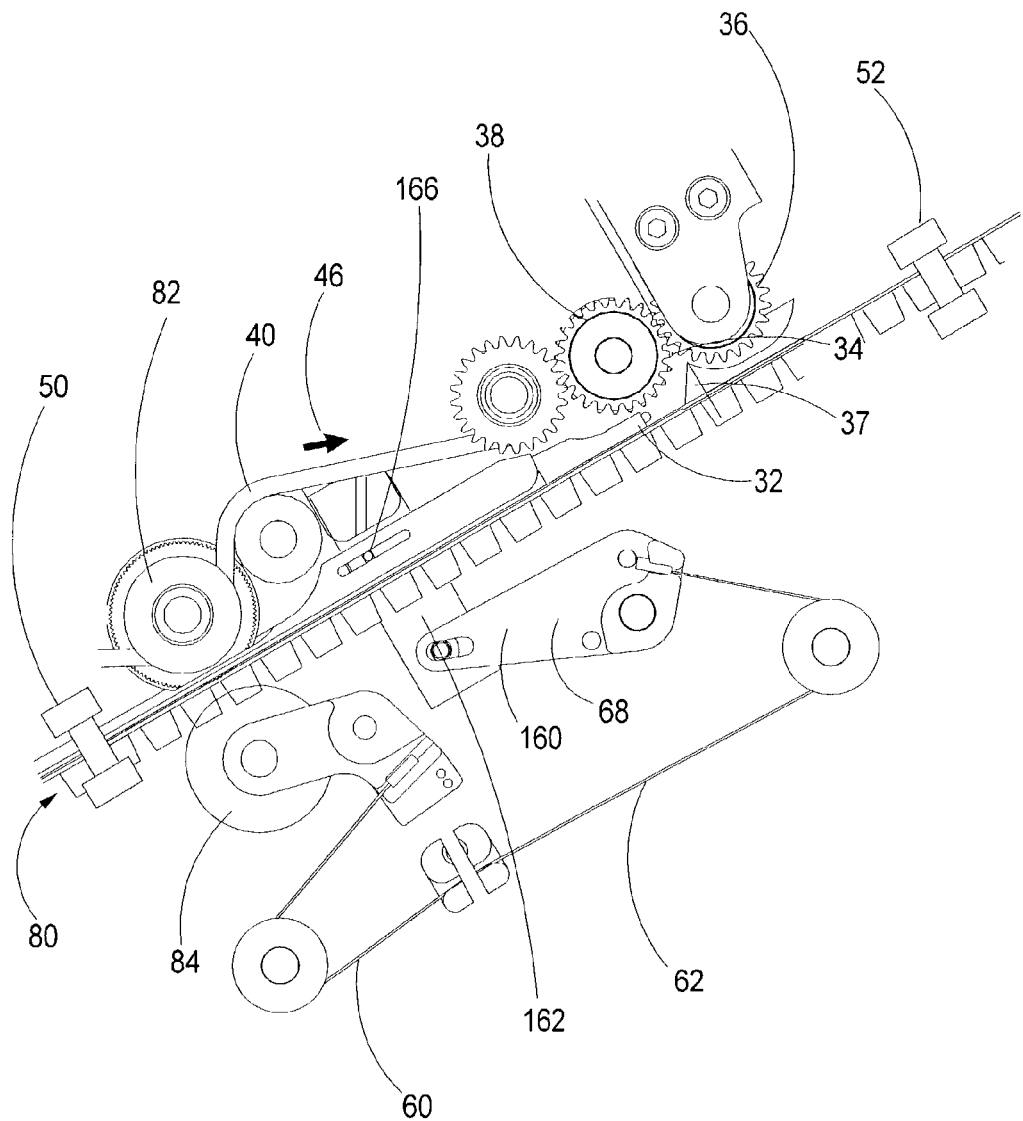
FIGS. 3A–3C are expanded detail drawings of particular aspects of the feeder embodiment shown in FIGS. 1 and 2.

Turning briefly to FIG. 3A, the details of tape sensor or detector 50 are described. In one embodiment, the tape sensor 50 is an optical through beam interrupter that provides a tape present indication or signal as soon as the tape is inserted in the tape guide 20. Operation of sensor 50 is preferably independent of component tape size, and as the tape is inserted in the guide the detector changes state and this initial change is the primary function required to initiate the load operation. Various sensor types may be employed for the tape detector, such as Honeywell (also Fairchild) which manufacture an emitter-detector sensor pair (Nos. SEP8505-002 and SDP8405-002). The tape load sensor 50 is preferably located along tape guide 20 so as to activate the sensor as the tape 28 is inserted by an operator and to cause the component tape drive at auto-loading nip 80 to advance the tape, once detected by sensor 50.

Continuing with FIG. 3A, the component tape normal force at auto-loading nip 80 is operational only when a new tape, with or without a leader, such as the case with a partial reel of components, is inserted into the feeder. In this case, when the new leader is detected by sensor 50, the following sequence of events occur to advance the component tape to the peel edge and begin peeling of the cover tape and depositing the peeled tape in the reservoir. Further detail of the auto-load process is described below relative to FIG. 6.

Having described the initial auto-loading sequence, attention is now turned to the right side of FIG. 3A, where the details of the tape transport path and the tape-loaded sensor 52 are described. Subsequent to the removal of the cover tape, it is desirable to assure that the component tape remains covered or that the top surface of the tape is in contact with a "surrogate cover" as it is advanced toward the pickup location. In the embodiment depicted in FIGS. 1 and 3A, the cover is accomplished via the tape guide 20, in conjunction with drive roller 76. While roller 76 is shown as only contacting the tape surface for a brief portion of the region between cover tape peeling and the pickup location, it is also conceivable that the frictional drive force imparted by roller 76 may be accomplished with a belt or similar mechanism contacting the component tape over a larger portion of the region, as described for example in "SELF-THREADING COMPONENT TAPE FEEDER," Lyndaker et al., application Ser. No. 60/293,397, previously incorporated by reference.

Turning to the sensor, in one embodiment, the tape-loaded sensor 52 has a standard interrupter module (emitter-detector) where the opaque tape comes between the light emitter and photodetector. It is believed that adequate detection of the tape may be accomplished by such a sensor. Moreover, as will be described below, the sensors may be able to detect variations in the translucent or opaque features of the tapes in order to detect pocket edges, pocket holes (in some tape types) and possibly even the presence of absence of components in the pockets.

Figure 3B:
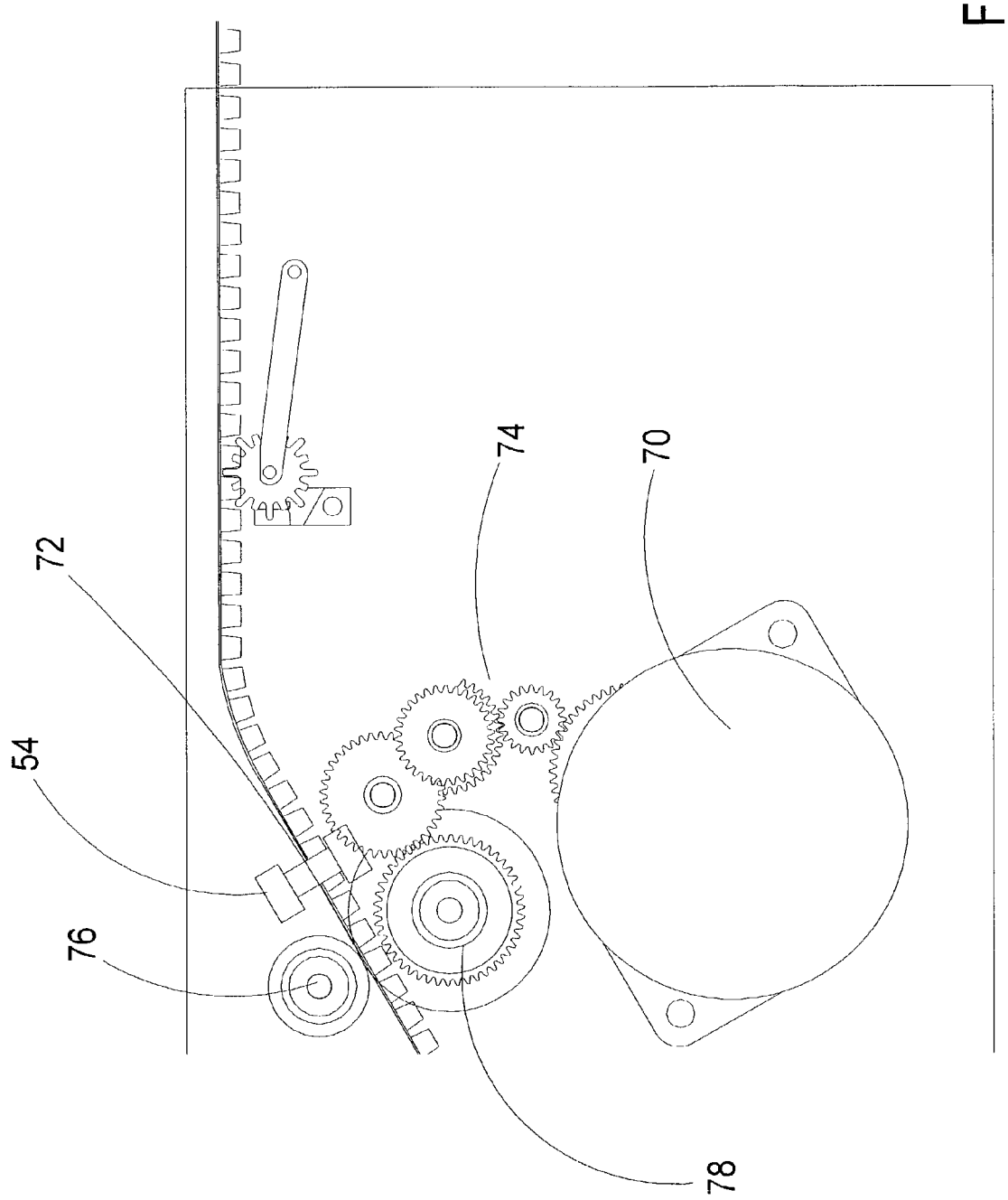

Alternatively, the tape-loaded sensor 52 may be offset from the tape path and responsive to a flag, where the flag is moved upward as the tape is advanced toward the pickup location, where flag 90 interrupts the sensor signal in response to component tape advancement. Referring to FIG. 3B, the details of part detector sensor 54 are illustrated and will now be described in more detail. In an optical sensor embodiment, a through beam interrupter provides a "part present" indication. The detector resides between the tape advance roller and the pickup location. The detector signal is a function of the parts carrier tape. Paper tape carries parts in appropriately sized cutouts within the tape, the parts are held in place by upper and lower translucent cover tapes. Parts and the paper web between parts block the light, whereas empty pockets do not. Hence, the tape pitch (spacing between pockets) can be determined by measuring the tape present sensor output while feeding the leader. Pitch size may be used, by the feeder as one means of validating that a new tape is supposed to be fed by the feeder—where the new tape must be the same pitch as the previous tape.

Plastic embossed tapes carry parts in embossed pockets, and the parts are held in place by a translucent cover tape. Moreover, pockets larger than 1.5 mm often have a 1.0 mm hole in the bottom of the pocket. Plastic embossed tapes come in two varieties; clear and opaque (black). Accordingly, in one embodiment, the part detector is biased such that it "sees" through the lower layer of component tape (paper tape) or the hole in the pocket (plastic embossed tape). Hence the sensor operation may be dependent on the component tape type. Knowing that the part sensor 54 is located a predefined distance away from the pickup point or location, the system is able to control the advancement and position of parts at the pickup location.

As an alternative, part sensor 54 may be an induction-type sensor that relies on the effect of the metal in the component parts to detect them. For example, the inductor is made from a toroid where a generated magnetic field outside the toroidal structure is canceled except for an area around the gap. The gap is filled with a non-magnetic conductor either from copper or aluminum such that the eddy current induced field in the conductor blocks the flux path trough the gap. The presence of additional metal close to the gap changes the flux path hence the inductance, the inductor is excited at a specific frequency and the resultant current is continuously monitored—with the changes indicating the presence of a part. It is believed that such an alternative may be preferred when the component size is less than 1.5 mm or in the absence of a hole in the pocket.

As noted above, another advantage of sensor 54, or other sensors along the tape path, is that they may be employed to accomplish automatic detection of the component tape pitch (the regular spacing between common locations adjacent component pockets—e.g., the distance between lead edges of adjacent pockets). In one embodiment, as noted above, the sensor may be used to detect the lead or trail edge of a component pocket or a hole therein. As described below with respect to FIG. 3B, the present invention also employs a frictional drive using a stepper motor to advance the component tape to the pickup location. Because of the accuracy of the tape advancement, it is possible to use a stationary sensor such as sensor 54 to detect features of the component tape pockets in order to automatically determine the component tape pitch. For example, such a process would include advancing the component tape under the control of the frictional drive, where the drive is being driven by a stepper motor. Preferably, using a stepper or similar drive motor enables a particular linear displacement of the component tape for each step. The relationship may be predetermined and is a function of the drive and the gearing used to impart the driving force to the component tape. While advancing the component tape, the sensor is used to monitor or detect the presence of a repeatable feature of the component tape. For example, the leading edge of a pocket or the pocket hole, both of which are at a spacing equivalent to the pitch of the component tape. Based upon the known displacement of the tape, from the stepper motor, in conjunction with the signals from the sensor, the feeder may be programmed to have the micro-controller (µC), such as the µC in FIG. 5, determine the tape pitch in response to the detection of the repeatable features and the intervening linear displacement. It is further contemplated that a pre-programmed look-up table may be employed to determine the pitch, where the number of steps between repeatable features is used as an index to the table and the resultant pitch is then stored in the table. It will be appreciated that the feature of automatically detecting a component tape's pitch may be employed for purposes of validation, for example, as a check to determine if a newly fed tape that has been automatically loaded is of a pitch that is the same as the previously fed tape. Albeit a gross comparison, it is believed that such a feature might be used to prevent feeding of the wrong components.

Figure 3C:
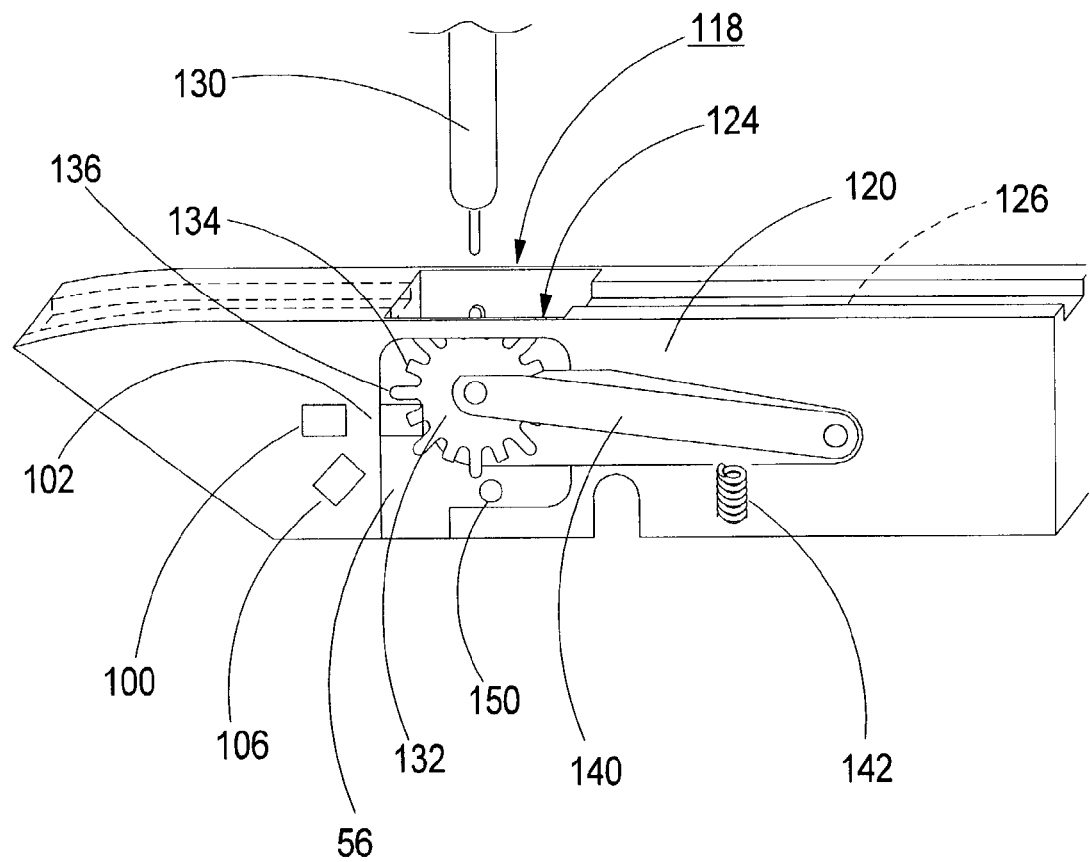

The last sensor is a pick-point sensor 56 as depicted in FIG. 3C. In operation, the pick point sensor 56 detects the location of the drive holes while drive motor 70 is advancing the component tape 28 a pre-defined distanced based on the fixed linear dimension between sensor 56 and the pick point 118. Therefore sensor 56 provides absolute positioning of the pocket center relative to the component tape drive holes. However, instead of simply looking at slots with an interrupter module this detector monitors slots or voids in an encoder wheel which engages the drive holes located in the component tape, this facilitates improved positional resolution and motion control More specifically, the sensor includes an emitter 100 angled to emit light on an inclined surface 102 behind the encoder wheel 132, which reflects light through the encoder wheel where it is sensed by detector 106. In order to overcome significant space constraints near the pickup-location, the detector is mounted directly in front of the encoder. The inclined surface between the emitter and detector allows the sensor to be used in conjunction with the encoder wheel without increasing the required width of the feeder. Encoder slots are placed so as to enable tape indexing at a resolution of at least 4.0 mm increments, and possibly in 2.0 mm increments.

Pick point sensor 56 is used, in conjunction with Stepper Motor 70 to control the advancement of the component tape once it has been loaded and the cover tape has been peeled therefrom. The stepper motor, preferably manufactured by Thompson (Part No. Airpax), controls part positioning at the pickup point. A gear train 74 couples the stepper to the carrier tape through a friction drive nip 72 (rollers 76 and 78, where roller 78 is driven by the gear train). A friction drive system has been discovered to facilitate laminar motion control, which has been proven to be advantageous in minimizing part disruption. This is to be contrasted with known tape advance means that engage a sprocket in a hole—where the tooth involute causes a motion impulse or disturbance as it disengages from the drive hole. Additionally, the inherent backlash between the tooth and the drive hole is eliminated when motion direction is reversed.

Continuing to refer to FIG. 3C, the enlarged view of the pickup station 118 is shown. Pickup station 118, includes a cover 120 having a pick window or orifice 124 through which a pick-and-place machine head, having a vacuum nozzle 130, may access the components within the component tape pockets. Pickup station 118 further includes a continuation of the tape guide or channel therethrough (shown as dashed line 126) in which the tape travels, again acting as a surrogate cover in place of the cover tape peeled well before the pickup location. Furthermore, the channel is of a design so as to assure that the components within the component tape are maintained within the uncovered pockets as the tape is advanced to the pickup location. Operatively associated with the pickup station, preferably at a point near or adjacent the pickup location, is an optical encoder wheel 132, or a similar device, for precisely sensing the position and motion of the carrier tape. Encoder wheel 132 preferably includes teeth 134 of a height sufficient to contact the equidistant drive holes along an edge of the component tape. Alternatively, as depicted in FIG. 3C, a second set of teeth 136 of a different height may be included along an outer perimeter of the encoder wheel.

The nature of the tooth design, including the heights and the spacing of the larger teeth 134 allow for the automated insertion of the teeth into the drive holes of the component tape. More specifically, the encoder wheel or sprocket 132 is pivotally mounted on the end of lever arm 140. Lever arm 140 is biased in an upward manner by compression spring 142. When the edge of the component tape leader comes into contact with the long teeth 134 of the encoder wheel, the entire encoder wheel is caused to be displaced in the downward direction in order that index pin 150 can engage the longer teeth to limit rotation until the encoder wheel becomes engaged in the next component tape hole. Hence, the encoder wheel is forced and held downward until the carrier tape advances far enough so that one of the longer teeth on the sprocket engages the next drive hole and the encoder wheel is then "synchronized" with the component tape drive holes. Moreover, the design of the encoder wheel and its synchronizing feature allow the auto-loading of the component tape without the need for operator intervention to align the component tape drive holes with a toothed sprocket as is known in conventional tape feeders.

Subsequently, the longer teeth engage successive drive holes, whereas the optical encoder may be employed to sense the long teeth 134 in approximately 4.0 mm resolution, or the long and short teeth in an alternative embodiment to achieve 2.0 mm resolution. It will be appreciated that alternative features distributed radially about the encoder wheel 132 may be used to detect the position of the carrier tape at a resolution of at least twice the drive hole pitch or greater. Furthermore, because the encoder wheel is only used for position sensing, and the drive under the control of stepper motor 70 is a continuous, friction drive system, the present invention is believed to overcome the variable speed and non-laminar or impulse movement that is frequently encountered in systems that drive the component tape via a sprocket that is inserted into a drive hole. More specifically, the position and speed disruption caused by contact between the drive sprocket teeth and tape drive holes is overcome by the present invention and its ability to drive the tape using a stepper motor and frictional drive nip to transmit a driving force to the component tape.

Referring again to FIGS. 1 and 2, the rapid advancement of the component tape to the cover tape peel edge 32 is enabled as a result of the component tape drive at auto-loading nip 80 which is a central element of an automated cover tape peeling station. Auto-loading nip 80 is formed between belt driven pulley 82 and opposing pressure roller 84. When engaged, by bringing pressure roller 84 into contact with the lower surface of the component tape, the component tape 28 is advanced through the auto-loading drive nip 80 by the frictional contact with rollers 82 and 84. Once the leading edge of the component tape reaches the peel edge, the cover tape only is deflected by a diverter 37 into the area between cover tape drive gears 36 and 38 which are designed to take up the cover tape in such a way as to separate it from the pocket tape as it moves in a forward direction. As illustrated in FIGS. 1 and 2, the feeder preferably uses shape memory wires to engage a pressure roller 84 against the component tape thereby capturing the component tape, and to concurrently pull back the peel edge or anvil 32 to provide an unobstructed pathway into the cover tape reservoir via cover tape nip 34 and cover tape peel force drive rollers 36 and 38. In a preferred embodiment, as the cover tape peel edge is pulled back, cover tape diverter 37 interacts with the cover tape in order to direct the cover tape on the component tape leader toward the cover tape peel nip between drive rollers 36 and 38. In other words, the peel edge is retracted, thereby opening up what is usually a very small peeling "aperture" in order to widen the aperture so that the cover tape will readily pass to the nip region where it can be engaged by the cover tape nip.

When the cover tape has been advanced into the auto-loading nip, the nip pulls the cover tape from the top surface of the component tape about the cover tape peel edge 32, when the peel edge is in its operating position (the shape memory actuator 62 has relaxed) with a small peeling aperture—slightly spaced apart from the diverter 37 and below the auto-loading nip 80. In some circumstances, as the cover tape is being peeled from the component tape, components may stick to the cover tape. Accordingly, a second function of the diverter 37 is that it serves to assure that when the peel edge is in its operating position, components are not allow to remain attached to the underside of the cover tape as the cover tape is pulled about the peel edge.

It will be further appreciated that the self-threading or auto-loading of the cover tape into the nip 80 is a significant improvement over conventional systems, where the cover tape must either be threaded by an operator, past a cover tape peel edge, or where tapes must be spliced to one another. Because the cover tape is peeled from the component tape well before the pickup location, starting with the diverter 37, the diverter, the upper surface of tape guide 20, and the drive roller 76 all form a "surrogate" cover for the components in order to keep the components in the pockets until they reach the pickup location.

In one embodiment, the shape memory wires are made by Dynalloy and marketed under the trade name Flexinol™. Shape memory wires are devices that, when heated by passing a current through them, shrink in length and return to an original length when cooled back to ambient temperature. The wires employed in the feeder have a diameter of approximately 0.005 inches, a resistance load of about 1.3 Watts/inch, and produce a maximum pull force of approximately 330 grams to operate the pressure roll actuator 86 and pivot it about point 88 Operation of the shape memory wire actuator requires a drive current on the order of 400 milliamps for a time of approximately 1.0 seconds for engagement, and a cooling time of approximately 0.5 milliseconds to disengage.

Referring briefly to FIG. 3A once again, the other half of the shape memory wire system is employed to control the position of the peel edge 32 as the component tape 28 is advanced by belt 40. In particular, a mechanical actuator system 68 is employed to control the position of the peel edge. Once the tape-in sensor 50 signals the presence of a component tape, the controller (not shown) energizes shape memory wire segment 60, as described above, and shape memory wire segment 62 for approximately one second. As wire segment 62 heats up, it pulls armature 160 in a clockwise direction. Armature 160 thereby moves linkage 162 in an upward direction which causes the peel edge 32 to be retracted as peel edge 32 and linkage 162 are connected by a pin 166 that extends from the side of the peel edge and into a Z-shaped slot in the linkage. Hence, energizing wire segment 62 pulls back the peel edge so that the loose end of the cover tape on the leader can be caught by the rollers 36 and 38 of cover tape nip 34.

Once the cover tape is pulled into the cover tape nip 34 and the reservoir 30, the continued pulling of the cover tape and force applied through the closed drive at auto-loading nip 80 advances the component tape in the feeder up to the load point as detected by tape-loaded sensor 52. When the tape-loaded sensor signals the presence of the component tape, the controller stops the DC motor, de-energizes the shape memory wire current drivers and waits approximately 500 ms during which time the pressure roller and the peel edge return back to their nominal initial positions. Subsequently, the controller preferably reverses the DC motor for a brief interval (approximately 100 ms) to relieve cover tape pressure against the peel edge 32 and the tape loading sequence ends.

After the tape has been loaded the controller engages both the stepper motor 70 and the DC motor 42 to advance the first part to the pickup point. As the component tape moves, the controller monitors sensor 54 in order to measures the distance between pockets, sets the appropriate pitch, locates the first component and places it in the pickup position. The time required to load the first part depends on the leader length. The tape load point is some distance away from the carrier tape friction roller nip 72, hence initially the cover tape drive continues to pull the tape into the feeder 18 via the cover tape however, at this time, the pressure roller drive at auto-loading nip 80 is not engaged. As this happens the sensor outputs should be changing; if not then it is possible that while the carrier tape was not successfully loaded because the cover tape leader failed to engage into the cover tape nip and the system will require exception processing or manual recovery. Having described the mechanical components of the feeder and the operation thereof, attention is now turned to FIGS. 5 and 6, which depicts the various electronic components of an embodiment of the present invention. While the present invention may be employed for multilane feeders, the following description is for a single lane implementation. Multilane implementations will simply replicate the necessary functions on a per lane basis; the feeder controller size will increase to accommodate the additional lane circuits but will share circuits as possible. The block diagrams summarize the various functions that, in turn, are further detailed in the circuit description section below.

Figure 4:
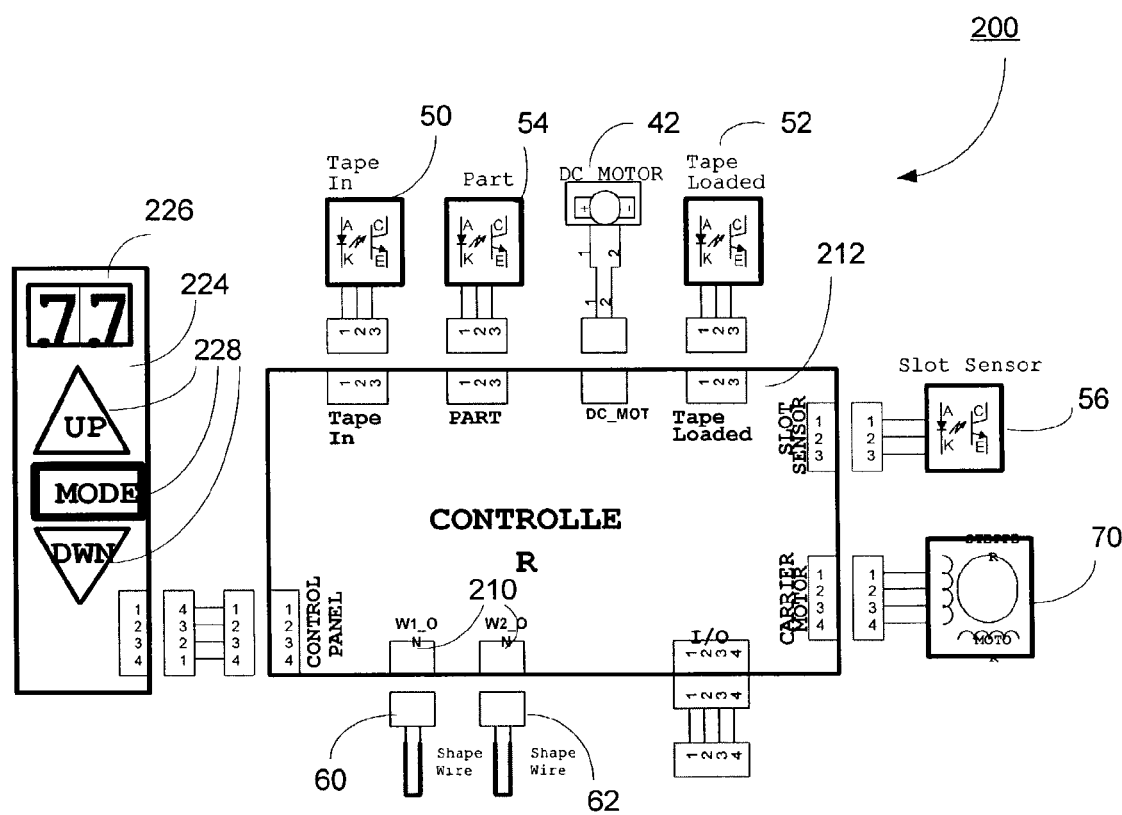
FIGS. 4 and 5 depict, in schematic and block diagram form, respectively, the control elements of a feeder operating in accordance with the present invention.
Figure 5:
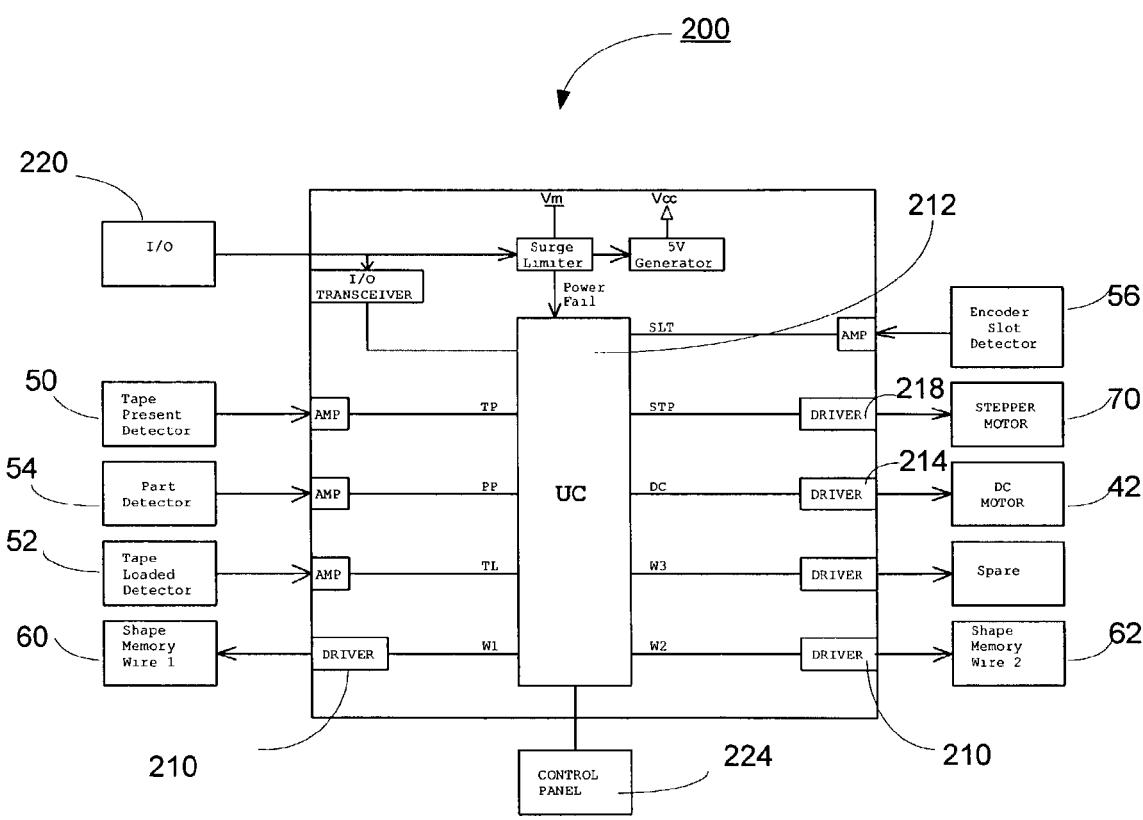

Turning to FIGS. 4 and 5, two block diagrams are presented; where FIG. 4 depicts the overall architecture 200 of the feeder and the control component structure. FIG. 5 shows a functional breakdown of the components, further depicting the flow of signals to and from the components.

As presently depicted, sensors 50–56 are of the photo interrupters type with LED emitters and phototransistor detectors. Except for the part sensor 54, the phototransistor does not require further amplification; hence only biasing resistors are used. The bias values will vary to accommodate the specific sensor tolerance spread and sensitivity requirements as is well known. The part sensor 54 has a 0.005 inch (0.127 mm) aperture to restrict the beam to a lower value than the width of the smallest part, which is a 0201 (0.02" long×0.01" wide).

The shape memory wire current is controlled by a wire driver 210 (for the first wire segment 60 or the second wire segment 62). The shape memory wires are, electrically, simple resistors (~5 Ohm), and the current devices require ~400 ma activation current. Accordingly, a unipolar current driver may be employed for wire drivers 210, where the driver pulse width modulates the applied voltage to reduce power dissipation. This circuit is basically an oscillator, where the inductor, the wire resistance, and the current hysteresis set the operating frequency. In the driver, a wire-on signal not only controls the timing of the wire drive but also provides power to the comparator (not shown) so as to prevent spurious current from flowing during power transients. The wire-on signals connects to the control processor, which places all I/O lines in the input mode in a reset condition hence the comparator cannot suffer from power transients.

The DC motor driver 214 is a bipolar current driver to permit bi-directional motion control for DC motor 42. This circuit is basically an oscillator with the switching frequency set by comparator hysteresis and the motors electrical parameters. In the current implementation, the switching frequency is approximately 200 KHz. This circuit is made up of two identical sections. Each circuit functions in a manner similar to the wire drivers. The CW and CCW signals control current polarity and gate the comparator output to the appropriate level converter.

Figure 6:
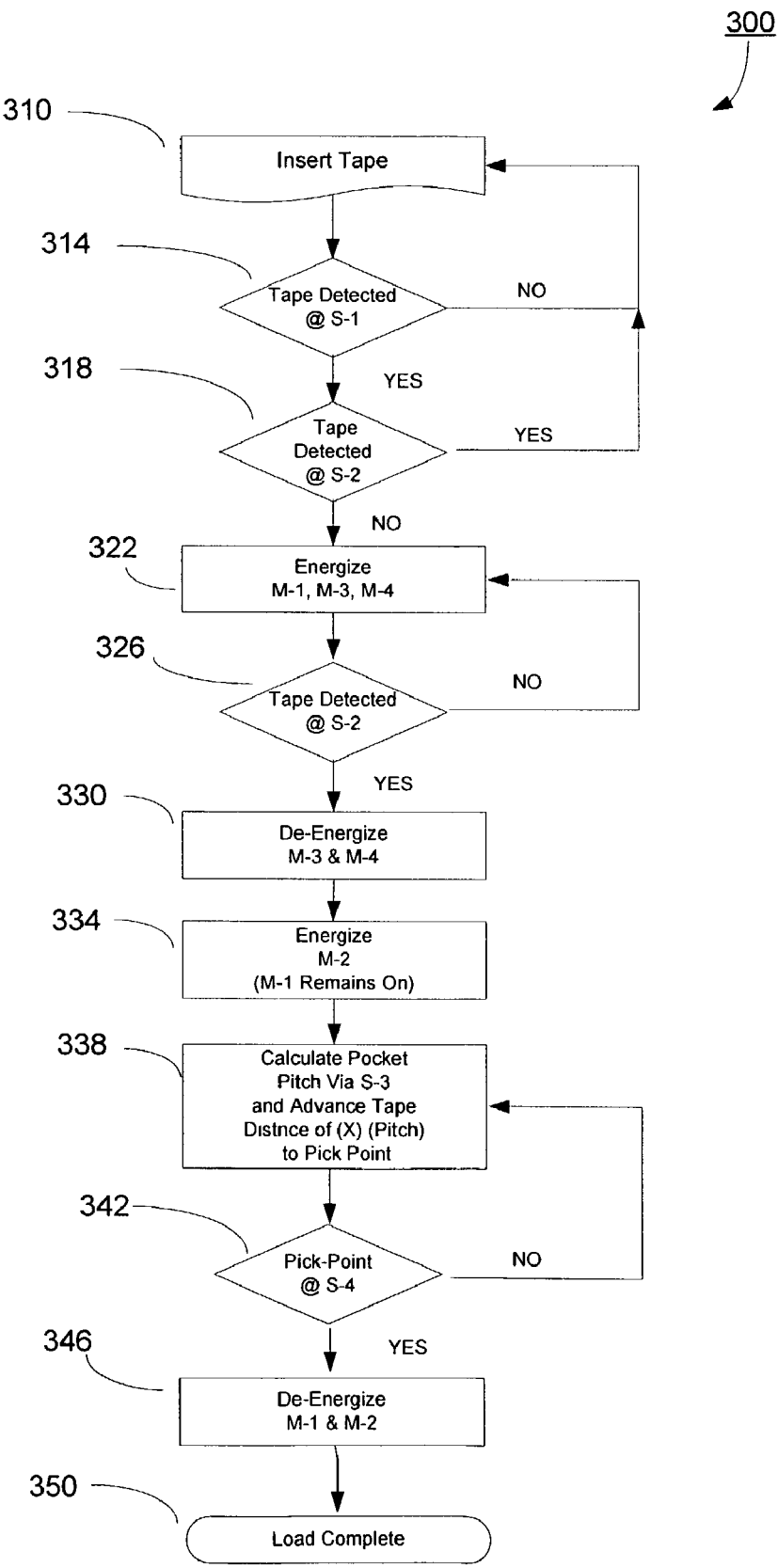
FIGS. 6 and 7 are illustrative flowcharts depicting, respectively, the auto-loading and run mode processes in accordance with the present invention.

In one embodiment, the control system 200 employs an Allegro UA3977SEP driver 218 and a stepper motor. The stepper motor driver is a constant off time switching controller with synchronous rectification; the chip can support current levels to 2.5 A peak and provide means to micro step the motor up to eight micro steps per step. In an off time controller a comparator senses the current levels and shuts off the power driver when the desired set point is reached, after a predetermined time the power stage is again enabled. Also depicted in FIGS. 5 and 6 is an I/O Transceiver 220, where the interface may be designed to connect to any number of pick-and-place machines which employ an interface. Similarly, the control panel 224 is taken directly from a conventional Hover-Davis SF series component feeder. A serial RS232 interface is used to link the feeder microcontroller 212 to the control panel display 226 and also decodes switch 226 actuation.

Also contemplated in accordance with the previously described controls are certain additional features that are generally summarized in the tables below:

TABLE A

| Diagnostic Mode Name | Description |
|---|---|
| Burn in Mode (Auto-feed) | This mode allows the feeder to automatically cycle the feeder mechanisms. |
| Display Feeder Firmware Revision | This mode will display a two-digit code that indicates which revision of feeder software is installed in the main feeder controller. |
| Display Cycle Count | This mode will display the total cycle count value on the display. |
| Display Jam Count | This mode will display the total jam count number on the display. |
| Display Insertion Count | This mode will display total tape insertion count (actually the number of times feeder power has been applied). |
| Advance Motor Check | This mode allows the advance mechanism drive motor to be driven forward or reverse to test its operation. |
| Cover Drive Check | This mode allows the cover drive motor to be driven to test its operation. |
| Tooth Sensor Check | This mode allows the user to test the pick point sensor. |
| Take Up Wheel Sensor Check | This mode allows the take up wheel arm sensor to be checked. |
| Control Panel Check | This mode allows the control panel buttons to be checked operation. |

TABLE B

| Configuration Mode Name | Description |
|---|---|
| Offset Setting Mode | This mode allows the pickup position of the feeder to be adjusted forwards and back. |
| Tape Width Setting Mode | This mode allows the feeder width to be set. The feeder will block out pitch settings that aren't appropriate for the width set. |
| Repair Time Set | This mode displays when scheduled maintenance is/was due, and allows the user to store the current cycle count value as the time of last repair. When one million advances has passed the feeder will begin displaying the repair message 'rr' at power up. |
| Jam Mode Reset Enable | This mode allows the feeder to be configured so the only way to make the feeder resume operation after the carrier tape drive system has jammed is to unplug it and plug it back in. |
| Pick-pick mode | This mode allows the feeder to accept every advance signal set to the feeder by the host machine. |
| Carrier Drive Motor Direction Set | This mode allows the feeder to be configured so the motor will spin in the opposite direction when running forward. |
| Factory Pick Point Adjust Mode | This mode allows the factory pick point setting to be examined and manually changed. |

Figure 7:
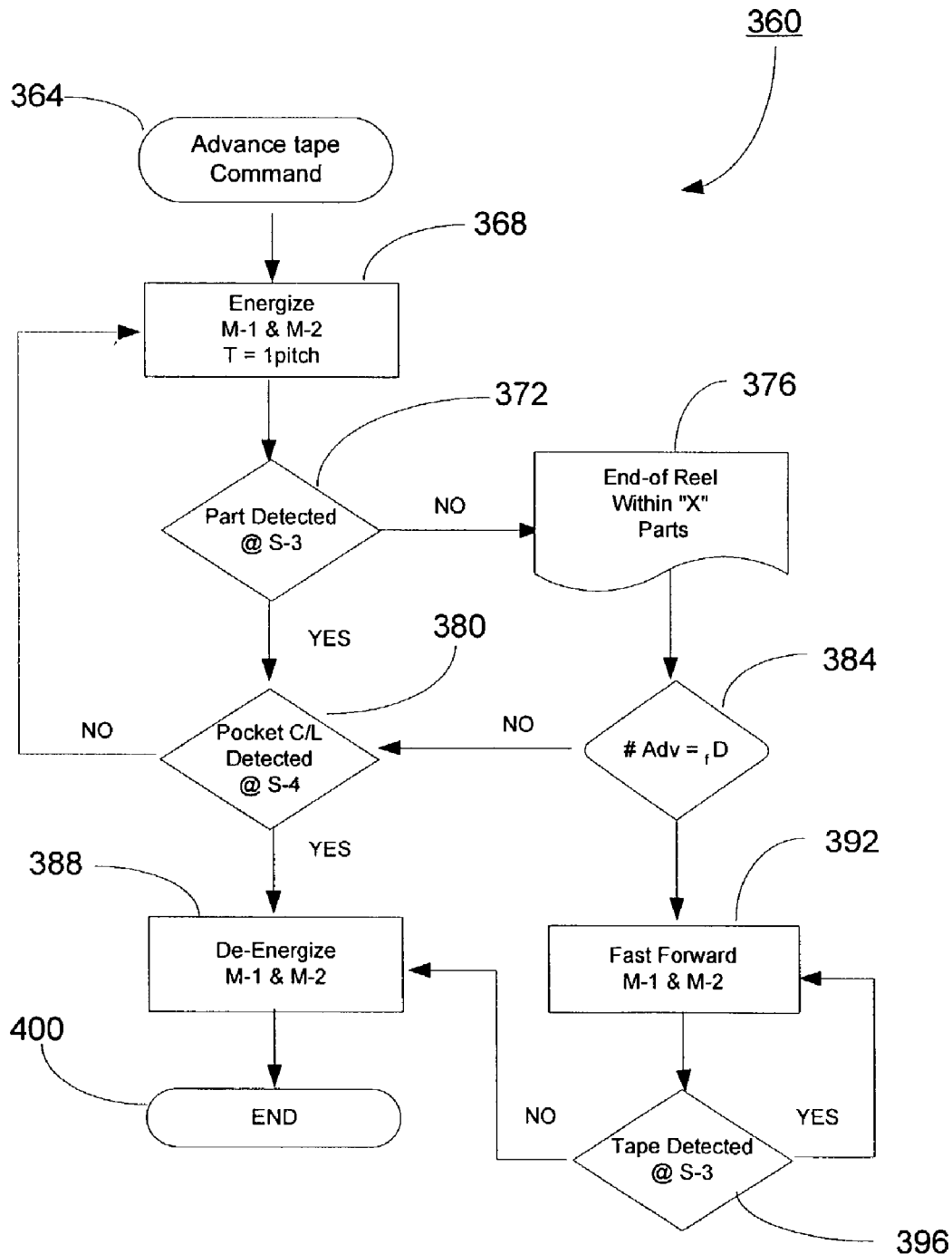

Having generally described the electrical and mechanical components of the present invention, attention is now turned to FIGS. 6 and 7, which respectively show the auto-load and run mode processes in accordance with the present invention. Referring first to FIG. 6, depicted therein is auto-load process 300, beginning with step 310, where a tape is inserted. In one embodiment the tape may be inserted manually by an operator. However, in an alternative embodiment, the tape may be inserted automatically, for example using the gantry-type device described in COMPONENT SOURCE INTERCHANGE GANTRY, by Peter Davis et al., Pub. No. US2002/0003994 A1, filed Jul. 2, 2001; where the reel may be placed in support 22 and advanced automatically so as to cause the component tape to advance into tape guide 22.

Once the tape is inserted it is detected by sensor 50 (S-1) at step 314, and the process simply loops between steps 310 and 314 until the tape is detected. Assuming the tape is not detected at step 318 by sensor 52 (S-2), the process advances from the initial loops at steps 314 and 318, to step 322, where motor 42 (M-1) and actuators (shape-memory wires) 60 and 62 are energized. This step causes the tape to be advanced under the control of the feeder—where motor 42 and the drive nip or belt in contact with the tape cause it to advance. Once the tape is detected at step 326, by sensor 52 (S-2), the process continues to step 330 where the actuators are de-energized so as to disengage the auto-loading drive nip 80 and to advance the peel edge to its nominal position. Subsequently, as represented by step 334, stepper drive motor 70 (M-2) is energized so that the stepper motor may control the advance of the component tape through friction roller nip 72. During this time, rive motor 42 (M-1) remains on in order to assure that the cover tape continues to be peeled as the component tape is advanced to the pick location.

As represented by step 338, the auto-load process also automatically determines the pitch of the tape being loaded. In particular, sensor 54 (S-3) is able to sense the locations of empty pockets in the tape leader, thereby enable the pitch of the tape to be determined. The sensor also senses the lead edge of the tape and determines the number of pockets that must be advanced so as to present a pocket with a component to the pickup location. As indicated in the loop between steps 338 and 342, the advance of the tape continues until the tape is sensed at the pickup location—as determined by motion in the encoder wheel 132 detected by sensor 56 (S-4). Once tape is detected at the pick location, the drive motors 42 and 70 are de-energized at step 346 and the auto-loading process is determined to be complete at step 350.

Referring next to FIG. 7, the run mode of operation for the auto-loading feeder is depicted in process 360. In the process, an advance tape command 364 initiates the process. Subsequently, at step 368, the process continues by energizing DC Motor 42 (M-1) and stepper motor 70. Subsequently, at step 372, sensor 54 (S-3) is interrogated to determine if a part is detected. If no part is detected, processing continues at step 376, where an end-of reel sub-process is initiated. More specifically, the sub-process seeks to determine if an end of reel is imminent, in order to signal for a new reel to be queued/loaded. At test step 384, the system executes a test (# Adv=$_i$D) to determine if, since detecting the first empty pocket at step 372, the number of components between the sensor position and the pickup location (based upon the pocket pitch detected) has been reached. If not, processing continues at step 380, otherwise, processing continues at step 392, where the tape is advanced in a fast-forward manner by energizing motors 42 and 70 at a high rate of speed until the tape is no longer detected at sensor 54 (S-3) as indicated by step 396. Assuming that a part was detected at step 372, or that the centerline (C/L) condition was not met at step 384 (tape was not advanced to position of the next component pocket), processing continues at step 380, where a test is executed to determine if C/L is detected.

If not detected at step 384, processing continues by looping back to step 368 where the tape is advanced one component or pocket pitch. If C/L is detected, processing continues at step 388, where the two motors are de-energized, having advanced the tape by one component, until the process completes at step 400. It will be appreciated that alternative sensing and processing steps may be employed in accordance with the run mode described herein. However, the run mode is optimized to operate in conjunction with the sensors and tape advancement components employed by the auto-loading feeder.

Figure 8:
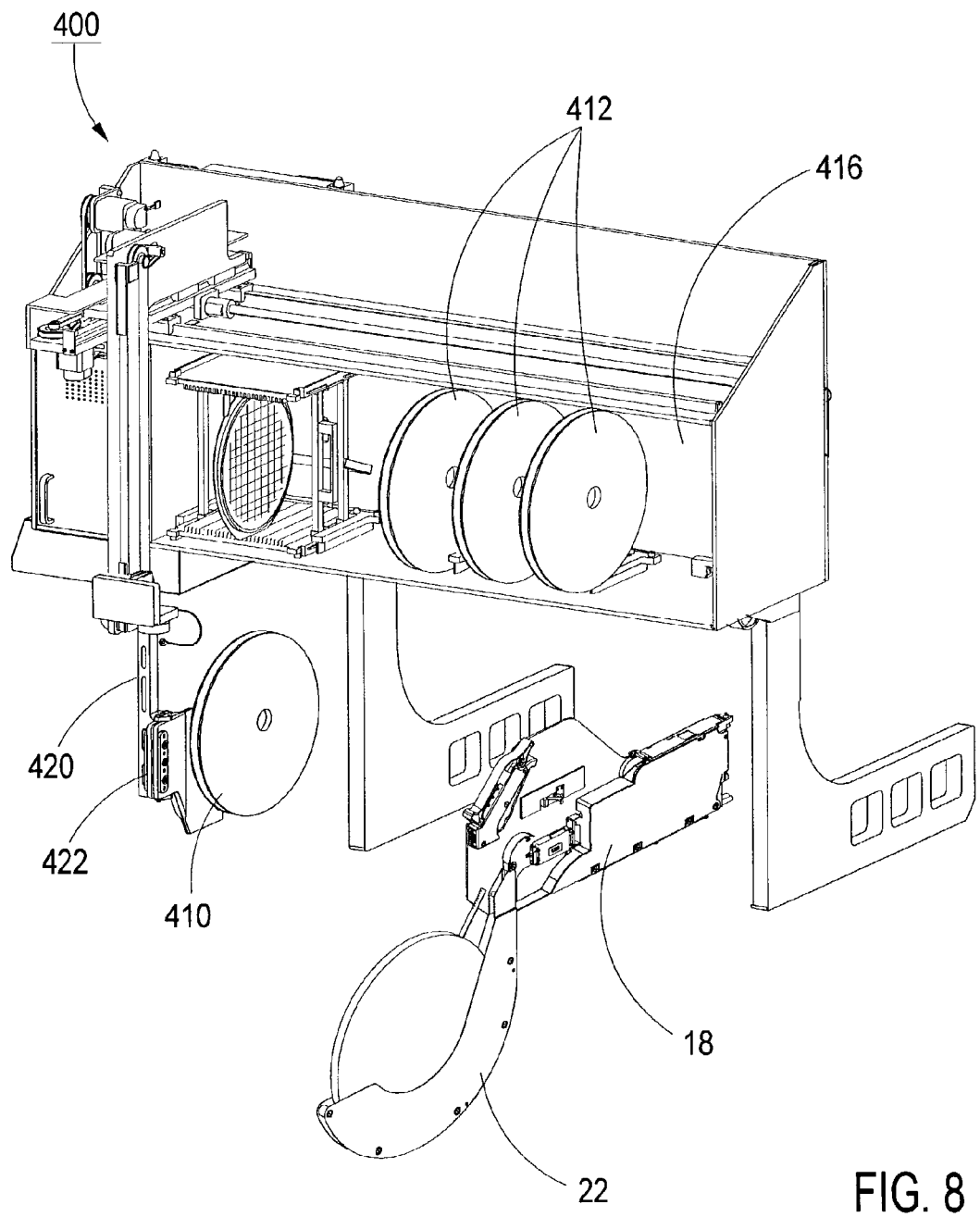
FIG. 8 is a perspective view of a portion of an alternative embodiment of the component interchange gantry system for use with tape reel component feeders.

As noted previously, it is possible to interface the present auto-loading feeder with a gantry or similar component tape reel replacement system 400 such as that described by Peter Davis et al. in Pub. No. US2002/0003994 A1, incorporated herein by reference and generally depicted in FIG. 8. Such a system may, in response to signals from the feeder (e.g., in response to a signal generated at step 392) automatically initiate the removal of an empty component tape reel 410 and the replacement of the empty reel with a full reel 412. Moreover, the replacement system, or the reel holder 22 of the feeder 18 will advance the reel so that a free leader is directed into the tape guide 20 (FIG. 1). This embodiment is generally indicated in FIG. 8. More specifically, it is further contemplated that in the place of a plurality of wafers stored in bay 416, a plurality of tape reels 412 may be stored therein and thereby made available to replenish empty reels 410.

As depicted in FIG. 8, a X-Y-Z gantry type robot system 400 may be employed to rapidly remove a depleted reel 410, store the depleted reel in the bay (or deposit it at another location), and subsequently retrieve a full reel 412 for insertion into the reel holder of the feeder. It will be further appreciated that the operation of system 400 may be pre-programmed to automatically interface with the feeder 18, so that feeder 18 may signal system 400 that the end of the component tape has been detected, and to initiate the automatic unloading and reloading sequence described. It is further contemplated that the gantry arm 420 and reel holding mechanism 422 may also operate so as to cause the component tape leader to advance into the tape guide to initiate the feeder's auto-loading process described above.

As has been discussed herein, the auto-loading feeder 18 (e.g., FIG. 1) senses the presence of component parts in the component tape pockets. For component tape leaders and trailers, the feeder is designed to handle the empty pockets by advancing that portion of the component tape through the pickup location. However, the ability of the auto-loading feeder to detect empty pockets in a tape leader, for a tape that is auto-loaded may also be used to enable further functionality for the feeder. In particular, detection of a newly loaded tape, and the leader thereon, enables the feeder to signal for or wait for an operator or system to confirm or validate that the correct tape has been loaded. In other words, the feeder may generate a signal, in response to detecting a new tape being loaded, that not only signals the pick-and-place system that a new tape is loaded, but may also disable subsequent feeding of the new tape unless or until the feeder receives a validation signal in return—either from an operator or another automated validation system. In this way, the present feeder may be used to not only automatically load new tapes, but to assure that the correct component tape has been loaded for feeding.

In recapitulation, the present invention is a method and apparatus for the automatic loading and advancement of component feeder tape in a component tape feeder for use with a pick-and-place PCB assembly system. The feeder employs sensing technology to determine when a component tape leader is inserted into a tape guide channel, and subsequently auto-loads the feeder with the tape, including the cinching of the cover tape within the take-up mechanism. Subsequently, the feeder operates to sense the presence of parts or components in the component tape pockets and to advance the component tape to a position where the first component is automatically presented at the pick location without removing the feeder from the assembly system.

It is, therefore, apparent that there has been provided, in accordance with the present invention, a method and apparatus for automatic loading and advancement of component feeder tape. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A method of automatically loading a component tape into a component tape feeder, comprising;
    detecting, the insertion of a leading edge of a component tape, into a tape guide;
    in response to detecting the insertion of the leading edge of the component tape, self-threading the component tape into a cover tape removal position;
    automatically initiating removal of a cover tape, from the surface of the component tape, to expose components therein, wherein removal of the cover tape involves self-threading the cover tape into a first drive nip;
    advancing the component tape into a second tape drive nip, wherein the component tape is self threaded into the second drive nip;
    detecting the spacing of pockets in the component tape and the presence of components in the pockets; and
    advancing the component tape into a pickup location, where a first pocket having a component detected therein is positioned at the pickup location for retrieval.

2. The method of claim 1, further comprising disposing of a removed cover tape by advancing the removed cover tape into a reservoir in conjunction with the self-threaded removal of the cover tape.

3. The method of claim 1, further comprising automatically calculating the component tape pitch as a function of the motion of the tape through the second drive nip, and in response to the detected spacing of pockets, said tape pitch being generally constant over the length of the component tape.

4. The method of claim 3, wherein commencing self-threading feeding operation further comprises:
    successively responding to the retrieval of a component from the pickup location; and
    advancing the component tape a distance equal to the tape pitch.

5. The method of claim 4, further comprising discharging a depleted component tape;
    detecting at least one empty pocket near an end of a component tape; signaling the end of the component tape; and self-threading a new component tape from a new tape reel, into the component tape feeder to minimize an interruption in the cycle time of the feeder.

6. A method of operating a component tape feeder in an auto-loading mode comprising the steps of:
   detecting the insertion of a component tape into a tape guide;
   in response to detecting the insertion of the component tape, automatically advancing, with a first component tape drive nip, the component tape to a cover tape removal position;
   initiating the removal of a cover tape from the surface of the component tape to expose components therein;
   automatically advancing the component tape to a second tape drive nip;
   detecting the spacing of pockets in the component tape and the presence of components in the pockets;
   automatically advancing the component tape to a pickup location, where a first pocket having a component present therein is positioned at the pickup location for retrieval;
   automatically calculating the component tape pitch as a function of detected spacing of pockets;
   automatically comparing a first component tape pitch of a newly loaded component tape with a second component tape pitch of an immediately preceding tape; and
   signaling a validation error if the first and second component tape pitches are not equal to one another.

7. A method of operating a component tape feeder in an auto-loading mode, comprising the steps of:
   detecting the insertion of a component tape into a tape guide;
   in response to detecting the insertion of the component tape, automatically advancing, with a first component tape drive nip, the component tape to a cover tape removal position;
   automatically initiating the removal of a cover tape from the surface of the component tape to expose components therein;
   automatically advancing the component tape to a second tape drive nip;
   detecting the spacing of pockets in the component tape and the presence of components in the pockets;
   automatically advancing the component tape to a pickup location, where a first pocket having a component present therein is positioned at the pickup location for retrieval; and
   requiring a validation signal, indicating that the component tape is a valid component tape, prior to the step of automatically advancing the component tape to a pickup location.

8. A method of operating an auto-loading component tape feeder and automatically calculating the component tape pitch of a component tape in the feeder, comprising the steps of:
   advancing the component tape under the control of a component tape drive, said drive being driven by a stepper motor where each step is known to correspond to a particular linear displacement of the component tape;
   self-threading the component tape to a location where a cover tape is separated from the component tape;
   while advancing the component tape, monitoring a sensor capable of detecting the presence of a repeatable feature of the component tape at a spacing equivalent to the pitch of the component tape; and
   in response to the detection of a first and subsequent repeatable feature by the sensor, determining the intervening linear displacement of the component tape by the component tape drive in order to automatically calculate the component tape pitch.

9. The method of claim 8, wherein the repeatable feature is a pocket edge.

10. The method of claim 8, wherein the repeatable feature is a pocket hole.

11. A method of operating an auto-loading component tape feeder, comprising the steps of:
    self-threading a first component tape to a location where a cover tape is separated from the component tape;
    detecting the presence of a component in each pocket of a first component tape;
    energizing a component tape drive to advance the first component tape a distance equal to the distance between the last component picked and the next component in the first component tape;
    detecting at least one empty pocket at an end of the first component tape;
    signaling the end of the first component tape; and
    in response to the end of the first component tape, self-threading a second component tape to a pickup location for retrieval, so as to avoid an interruption in the cycle time of the feeder.

12. The method of claim 11, wherein the step of detecting a component in each pocket further includes:
    receiving, from a component sensor positioned for determining the presence of a component in each of the plurality of pockets, signals indicating the presence of a component in a pocket; and
    using said signals to control the component tape drive and to assure continuous advancement of components at said pickup location.

13. The method of claim 12 wherein the component sensor generates said signal as a function of a variable eddy current in response to the presence of a component.

14. The method of claim 11, wherein detecting a component in a pocket further includes;
    using a toroid inductor having a gap containing a non-magnetic material therein, generating a magnetic field;
    canceling the magnetic field, about the gap, generated by the toroid; and
    detecting the presence of a component in proximity of the gap, in response to a change in the inductance of the toroid.

15. A method of self-threading component tape onto component tape feeder, comprising;
    inserting a component tape into a portion of a tape feeder;
    engaging the component tape within a transport mechanism of the tape feeder without any operator intervention within the feeder; and
    self-threading the component tape to a location where a cover tape is separated from the component tape to reveal components for retrieval.

* * * * *

UNITED STATES PATENT AND TRADEMARK OFFICE
CERTIFICATE OF CORRECTION

| | |
|---|---|
| PATENT NO. | : 7,220,095 B2 |
| APPLICATION NO. | : 10/154560 |
| DATED | : May 22, 2007 |
| INVENTOR(S) | : Lyndaker et al. |

It is certified that error appears in the above-identified patent and that said Letters Patent is hereby corrected as shown below:

<u>On The Title Page Item -56-, under Other Publications</u>
Line 3, delete "suppiled" and insert -- supplied --
Line 4, delete "japanese" and insert -- Japanese --

<u>Drawing Sheet 9</u>
Figure 7, delete "400" and insert -- 398 --

<u>Column 1</u>
Line 44, delete "a" and insert -- an --

<u>Column 5</u>
Line 38, delete "pitch detect" and insert -- pitch, detect --
Line 60, delete "will described" and insert -- will be described --

<u>Column 6</u>
Line 20, delete "gears At" and insert -- gears. At --
Line 33, delete "location Referring" and insert -- location. Referring --

<u>Column 7</u>
Line 1, delete "occur" and insert -- occurs --
Line 59, delete "varieties;" and insert -- varieties: --

<u>Column 9</u>
Line 4, delete "control More" and insert -- control. More --

<u>Column 11</u>
Line 2, delete "allow" and insert -- allowed --
Line 24, delete "point 88 Operation" and insert -- point 88. Operation --
Line 64, delete "measures" and insert -- measure --

<u>Column 12</u>
Line 9, delete "and"
Line 12, delete "5 and 6" and insert -- 4 and 5 --
Line 25, delete "structure. FIG. 5" and insert -- structure and FIG. 5 --
Line 51, delete "signals" and insert -- signal --
Line 58, delete "motors" and insert -- motor's --

<u>Column 13</u>
Line 14, delete "226" and insert -- 228 --

UNITED STATES PATENT AND TRADEMARK OFFICE
CERTIFICATE OF CORRECTION

PATENT NO.       : 7,220,095 B2
APPLICATION NO.  : 10/154560
DATED            : May 22, 2007
INVENTOR(S)      : Lyndaker et al.

It is certified that error appears in the above-identified patent and that said Letters Patent is hereby corrected as shown below:

Column 14
Line 15, delete "22" and insert -- 20 --
Line 32, delete "rive" and insert -- drive --
Line 39, delete "enable" and insert -- enabling --
Line 58, delete "end-of reel" and insert -- end-of-reel --

Column 15
Line 14, delete "400" and insert -- 398 --

Column 16
Line 29, delete "comprising;" and insert -- comprising: --

Column 18
Line 44 and line 53, delete ";" and insert -- : --

Signed and Sealed this

Seventh Day of August, 2007

JON W. DUDAS
*Director of the United States Patent and Trademark Office*